(12) United States Patent
Gurr

(10) Patent No.: US 6,806,706 B2
(45) Date of Patent: Oct. 19, 2004

(54) MODULATED CHEMICAL SHIFT IMAGING SOLVENT SUPPRESSION

(75) Inventor: David H. Gurr, Palo Alto, CA (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/304,488

(22) Filed: Nov. 26, 2002

(65) Prior Publication Data
US 2004/0100258 A1 May 27, 2004

(51) Int. Cl.⁷ .................................................. G01V 3/00
(52) U.S. Cl. ...................................................... 324/307
(58) Field of Search ................................. 324/300, 307, 324/309, 310, 312; 600/410

(56) References Cited

U.S. PATENT DOCUMENTS

| | | | | | |
|---|---|---|---|---|---|
| 4,728,889 A | * | 3/1988 | Gadian et al. | ............... | 324/307 |
| 5,532,594 A | * | 7/1996 | Cory et al. | .................. | 324/307 |
| 5,657,758 A | * | 8/1997 | Posse et al. | ................. | 600/413 |
| 5,709,208 A | * | 1/1998 | Posse et al. | ................. | 600/410 |
| 5,879,299 A | * | 3/1999 | Posse et al. | ................. | 600/410 |
| 6,046,588 A | * | 4/2000 | Watanabe | ................... | 324/307 |

OTHER PUBLICATIONS

Dwight G. Nishimura, Principles of Magnetic Resonance Imaging; Dept. of Electrical Engineering Stanford University; pp. 87–90, 177–187, Apr. 1996.

* cited by examiner

Primary Examiner—Christopher W. Fulton
Assistant Examiner—Dixomara Vargas
(74) Attorney, Agent, or Firm—Fletcher Yoder (57) ABSTRACT

A technique is provided whereby a solvent spectrum may be partially modulated from a spectrum of interest using magnetic resonance spectroscopic imaging. The technique utilizes a solvent suppression technique capable of variable levels of suppression and alternates the application of first and second suppressive pulses in the imaging sequence which differ in the degree of solvent suppression they produce. The alternation of these suppressive pulses results in the partial modulation of the solvent signal from the signal of interest after processing.

24 Claims, 7 Drawing Sheets

FOV

FIG. 12

MODULATED CHEMICAL SHIFT IMAGING SOLVENT SUPPRESSION

BACKGROUND OF THE INVENTION

The invention relates to magnetic resonance spectroscopy. More particularly, the invention relates to a technique for obtaining spectroscopic data in which a selected portion of a solvent signal is shifted away from the signal of interest by partial modulation of the solvent signal.

Magnetic resonance imaging (MRI) techniques are common in the field of diagnostic medical imaging. The MRI scanners apply a uniform magnetic field upon which various gradient fields have been superimposed. The uniform magnetic field homogenizes the spins of responsive material within the object such that the spins are effectively statistically aligned. An excitation RF pulse is then applied to synchronize the spins of the responsive material by directionally "tipping" the spins into a plane transverse to the uniform magnetic field. Upon removal of the excitation RF pulse, the spins realign with the uniform magnetic field and, in the process, emit resonance signals. Differences in these resonance signals attributable to each nuclear species are detected by the imaging system and are processed to produce a magnetic resonance image which is descriptive of the physiological structure of the subject. In the field of medical imaging the responsive material is typically hydrogen and, for simplicity, hydrogen will be discussed as an exemplary responsive material hereinafter. However it should be realized that hydrogen is not the only responsive material and that the following comments apply to other such responsive materials as well.

When hydrogen is a constituent of a molecule, the electron cloud of the molecule affects the magnetic field strength experienced by the hydrogen nuclei. The variation in the effective magnetic field strength predictably results in a small change to the precession frequency, or spin, of the responsive material. This variation in the precession frequency is manifested as a chemical shift which is different for different hydrogen-containing molecules. In medical imaging of a patient, this chemical shift allows different chemicals within the body to be identified and allows the concentration of such chemicals to be determined. A gradient magnetic field applied in addition to the static field will produce a spatially dependent frequency shift to all the chemical spectra, allowing their localization within the field of view. In particular, a Fourier transformation may be employed to calculate a chemical shift spectrum from the resonance signal, decomposing the signal into its frequency and spatial components with each frequency corresponding to a component of a specific chemical at a specific location in space. The spectroscopic and spatial information thereby obtained may be utilized in the fields of magnetic resonance spectroscopy (MRS) or magnetic resonance spectroscopic imaging (MRSI) depending on whether data is obtained in one dimension or more than one dimension, respectively. As compared to MRI techniques, which provide structural information about a subject's physiology, MRS and MRSI techniques generate a plot representing the chemical composition of the imaged region in conjunction with the structural information, thereby providing information about the chemical functioning of the subject.

However, these spectroscopic imaging techniques utilizing hydrogen nuclei may be problematic when applied to human patients due to the presence of the hydrogen nuclei in highly prevalent water and lipid molecules. In particular, the hydrogen found in water and in lipids can produce very strong resonance signals which can mask the resonance signal of lower concentration compounds of interest, usually metabolites such as choline, lactate, or creatine.

These solvent signals, that is, the water and lipid signals, may be suppressed to better discern the resonance signals of compounds of interest, such as metabolites, in MRS and MRSI. Examples of suppressive techniques include chemical shift selective (CHESS) saturation and short-time inversion recovery (STIR) for water and lipid suppression respectively. CHESS suppression may be used for short echo time chemical shift imaging and allows an operator to select the degree of solvent suppression to be employed. Because the CHESS suppression technique is functionally independent of the imaging process, however, mismatches between the chemical suppression and the image can lead to image artifacts and processing irregularities, including apparent negative concentrations of the solvent, which may impact contiguous frequencies of interest within the image. Indeed, complete water suppression by means of CHESS techniques may create a situation where information which might otherwise be determined from the water signal is unavailable. In particular, some solvent signal may be desired to provide frequency reference information during image reconstruction. It may therefore be desirable to preserve the frequency information or other information associated with the solvent signal.

It is also known in the field of MRS and MRSI that two-dimensional spectral-spatial pulses may be utilized which are selective in space and in frequency. These spectral-spatial pulses synchronize the refocusing pulses with the time-varying magnetic field gradients to provide the desired spatial and frequency selectivity. In general, these spectral-spatial pulses can be designed to avoid the excitation of unwanted chemical species, and may thereby be used to avoid or minimize a resonance signal from water or lipids. The spectral spatial pulses, however, because of their two-dimensional nature, produce long echo times which may be undesirable in many examination contexts.

One technique utilizing spectral-spatial pulses in MRS and MRSI employs two spectral-spatial pulses as the final two pulses of a point resolved spectroscopy (PRESS) sequence, i.e. a 90° tip angle RF pulse followed by two 180° refocusing pulses. While this technique will suppress the undesired water and lipid signal, components of the undesired water and lipid signal will continue to contaminate the signal of interest, producing erroneous frequency and concentration information. A further technique is to perform two separate acquisitions, one with water suppression and one without. The two separate data sets may then be used to perform artifact removal algorithms, i.e. $B_0$ correction, and water subtraction to enhance the signal of interest, though acquisition time is further increased due to the second acquisition.

Dual-band selective excitation is another technique used in MRS and MRSI. In dual-band selective excitation the water and non-water parts of the sample are differentially excited such that the water is only partially excited relative to the metabolites or other compound of interest. The resulting spectra therefore have a reduced water signal relative to the metabolites. However, even this reduced water signal interferes with the metabolite signal and prevents the application of artifact removing algorithms.

In addition, combined use of dual-band selective excitation and spectral-spatial pulses may allow for full modulation of a solvent signal. However, as noted above, some solvent signal is generally desired to provide frequency reference information during image reconstruction. Ideally, the information provided by the water signal would be available, but would not contaminate the signal of interest. In addition, the two-dimensional nature of the spectral-spatial pulses may lead to longer echo times and, therefore, to more time consuming acquisition sequences than may be feasible. A technique is therefore needed which allows for the rapid partial modulation of a solvent signal from a signal of interest.

BRIEF DESCRIPTION OF THE INVENTION

The invention provides a method of partially modulating a solvent spectrum from one or more spectra of interest. In accordance with one aspect of the technique, an imaging pulse sequence utilizing a first solvent suppressing pulse and the imaging pulse sequence utilizing a second solvent suppressing pulse are applied to a sample in an alternating fashion. The first solvent suppressing pulse sequence suppresses a solvent spectrum by a first amount and the second solvent suppressing pulse suppresses the solvent spectrum by a different amount.

In accordance with another aspect of the present technique, a method is provided for forming a magnetic resonance spectroscopic image. The method includes iteratively applying an imaging pulse sequence to a subject. The imaging pulse sequence is alternately preceded by a first solvent suppressive pulse and a second solvent suppressive pulse which differ in the amount of solvent suppression they produce. A resonance data set resulting from each imaging pulse sequence is acquired before applying the alternating imaging pulse sequence. An acquisition matrix is formed from the resonance data sets and is processed. The processed matrix is used to construct a spectroscopic image.

In accordance with another aspect of the present technique, a magnetic resonance spectroscopy imaging system is provided. The system includes a magnetic resonance scanner, one or more control and acquisition circuits operably connected to the scanner, system controller circuitry operably connected to the one or more control and acquisition circuits, and an operator interface station operably connected to the system controller circuitry. The system controller circuitry is configured to iteratively apply an imaging pulse sequence to a subject, to acquire a resonance data set resulting from each imaging pulse sequence before applying the alternating imaging pulse sequence, and to process the resonance data sets to produce a spectrum of interest. The imaging pulse sequence is alternately preceded by a first solvent suppressive pulse and a second solvent suppressive pulse which differ in the amount of solvent suppression they produce.

In accordance with another aspect of the present technique, a computer program for partially modulating a solvent spectrum relative to one or more spectra of interest is provided. The computer program includes a machine readable medium for supporting machine readable code and configuration code stored on the machine readable medium. The configuration code contains instructions for applying two or more imaging pulse sequences to a subject. The imaging pulse sequences are alternately preceded by a first solvent suppressive pulse and a second solvent suppressive pulse which differ in the amount of solvent suppression they produce.

In accordance with another aspect of the present technique, a magnetic resonance spectroscopy imaging system is provided. The system includes a magnetic resonance scanner, one or more control and acquisition circuits operably connected to the scanner, system controller circuitry operably connected to the one or more control and acquisition circuits, and an operator interface station operably connected to the system controller circuitry. The system controller circuitry comprises a means for producing a magnetic resonance spectroscopic image in which a solvent spectrum is partially modulated from one or more spectra of interest.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
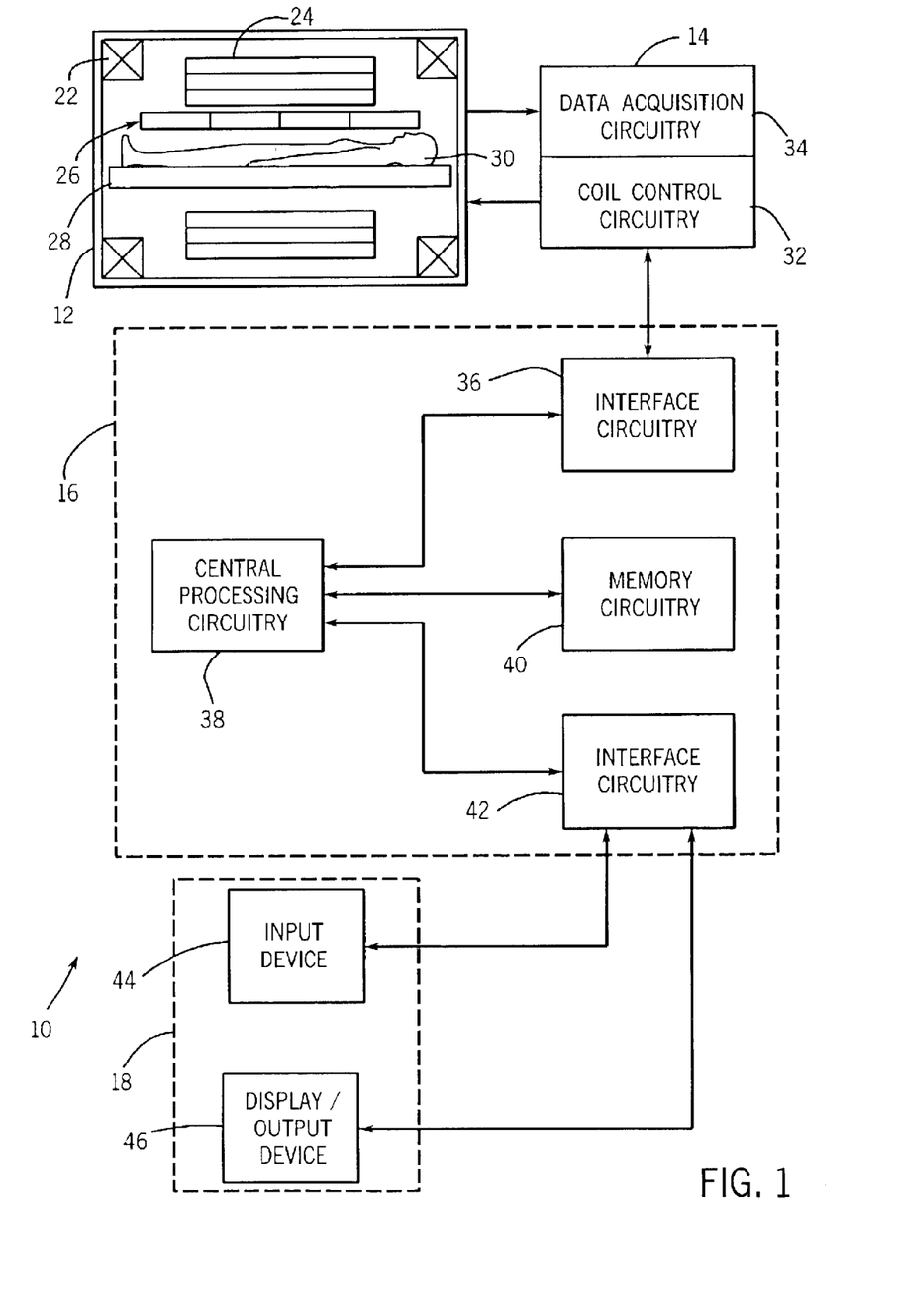
FIG. 1 is a diagrammatical representation of a magnetic resonance imaging system for use with magnetic resonance spectroscopic imaging.

Referring now to FIG. 1, a magnetic resonance imaging system, designated generally by the reference numeral 10, is illustrated as including a scanner 12, control and acquisition circuitry 14, system controller circuitry 16, and an operator interface station 18. The scanner 12, in turn, includes coil assemblies for selectively generating controlled magnetic fields used to excite spin systems in a subject of interest. In particular, the scanner 12 includes a primary coil 22, which will typically include a superconducting magnet coupled to a cryogenic refrigeration system (not shown). The primary coil 22 generates a highly uniform magnetic field along a longitudinal axis of the scanner. A gradient coil assembly 24 consisting of a series of gradient coils, and a RF transmit coil 26 is also provided for generating controllable magnetic fields having desired orientations with respect to the subject of interest. In particular, as will be appreciated by those skilled in the art, the gradient coil assembly 24 produces fields in response to pulsed signals for selecting an image slice, orienting the image slice, and encoding excited spin systems within the slice to produce the desired image.

In the illustrated embodiment, RF transmit coil 26 also serves as a receiving coil assembly for detecting emissions from spin systems during data acquisition phases of operation of the system. A table 28 is positioned within the scanner 12 to support a subject 30. While a full body scanner is illustrated in the exemplary embodiment of FIG. 1, the technique described below may be equally well applied to various alternative configurations of systems and scanners, including smaller scanners, and scanners incorporating single channel, phased array and similar receiving coil structures. Moreover, the signal combining techniques described below may find application outside of the field of magnetic resonance imaging, and outside of the field of medical imaging in general.

In the embodiment illustrated in FIG. 1, the control and acquisition circuitry 14 includes coil control circuitry 32 and data acquisition circuitry 34. The coil control circuitry 32 receives pulse sequence descriptions from the system controller 16, notably through the interface circuitry 36 included in the system controller 16. As will be appreciated by those skilled in the art, such pulse sequence descriptions generally include digitized data defining pulses for exciting the gradient coil assembly 24 during excitation and data acquisition phases of imaging. Fields generated by the RF coil assembly 26 excite the spin system within the subject 30 to cause emissions from the material. Such emissions are detected by a RF coil assembly 26 and are filtered, amplified, and transmitted to data acquisition circuitry 34. Data acquisition circuitry 34 may perform preliminary processing of the detected signals, such as amplification of the signals. Following such processing, the amplified signals are transmitted to the interface circuitry 36 for further processing.

In addition to the interface circuitry 36, the system controller 16 includes central processing circuitry 38, memory circuitry 40, and workstation interface circuitry 42 for communicating with the operator interface station 18. In general, the central processing circuitry 38, which will typically include a digital signal processor, a CPU or the like, as well as associated signal processing circuitry, commands excitation and data acquisition pulse sequences for the scanner 12 and the control and acquisition circuitry 14 through the intermediary of the interface circuitry 36. The central processing circuitry 38 also processes image data received via the interface circuitry 36, to perform 2D Fourier transforms to convert the acquired data from the time domain to the frequency domain, and to reconstruct the data into a meaningful image. The memory circuitry 40 serves to save such data, as well as pulse sequence descriptions, configuration parameters, and so forth. The workstation interface circuitry 42 permits the system controller 16 to receive and transmit configuration parameters, image protocol and command instructions, and so forth.

The operator interface station 18 includes one or more input devices 44, along with one or more display or output devices 46. In a typical application, the input device 44 will include a conventional operator keyboard, or other operator input devices for selecting image types, image slice orientations, configuration parameters, and so forth. The display/output device 46 will typically include a computer monitor for displaying the operator selections, as well as for viewing scanned and reconstructed images. Such devices may also include printers or other peripherals for reproducing hard copies of the reconstructed images.

Figure 2:
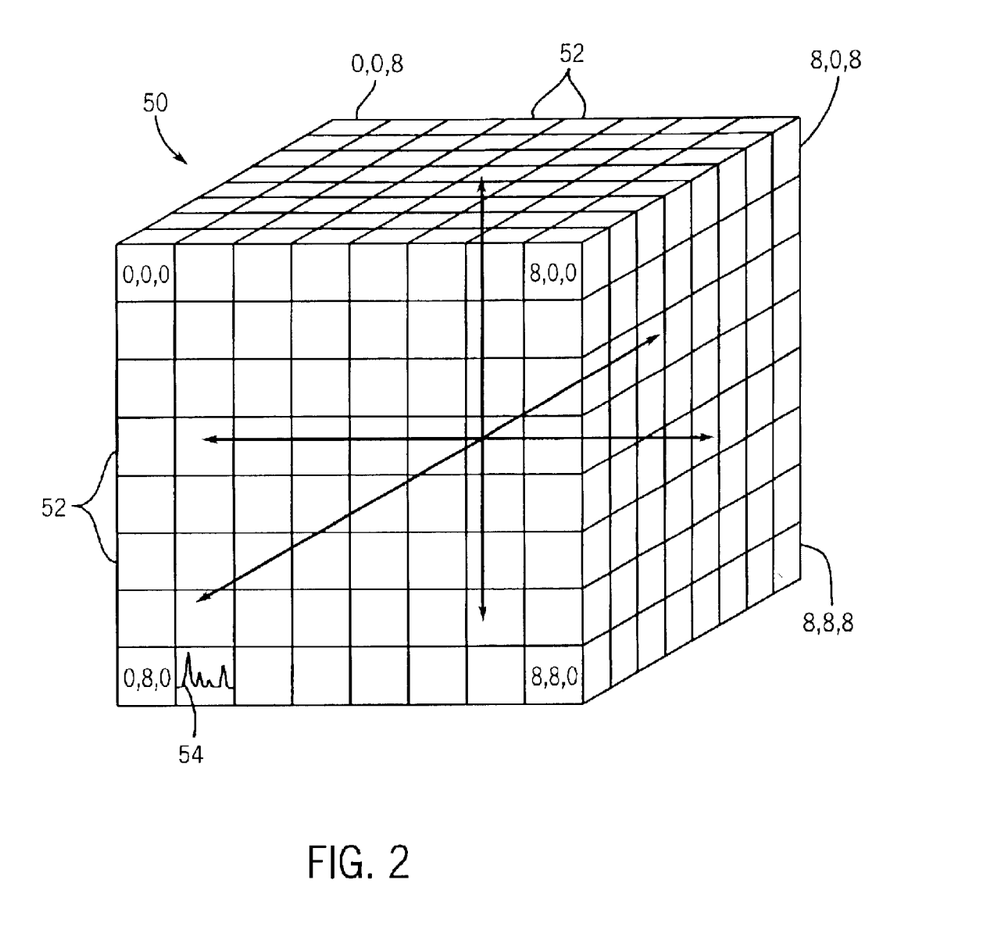
FIG. 2 is graphical depiction of a reconstructed data set associated with a chemical shift imaging volume of a magnetic resonance imaging system.

The system 10 of FIG. 1 may be used to acquire imaging information from a subject within a particular imaging volume located within or about the subject. An idealized imaging volume, represented as a cube 50, is depicted in FIG. 2. The cube 50 comprises an assortment of three-dimensional voxels 52, represented as unit cubes which may be localized by the intersection of three orthogonal slices generated by such techniques as Stimulated Echo Acquisition Mode (STEAM) or Point Resolved Spectroscopy (PRESS). Each imaging region of the subject represented by a voxel 52 conveys information regarding location, here represented by a three-dimensional coordinate system, i.e. 0,8,0, etc., derived by the operation of the gradient coil assembly 24. In addition, each voxel 52 conveys information regarding the chemical composition of the imaging region of the subject represented by the voxel 52. This information takes the form of a spectrum 54 of resonance frequency information which can be decomposed to determine chemical composition and concentration within the imaged region. The spectrum 54 may be represented as providing frequency information along the "x-axis" and concentration information along the "y-axis". Though only one spectrum 54 is depicted in FIG. 2 for diagrammatic purposes, each voxel 52 of the imaging volume contains such spectral information.

Figure 3:
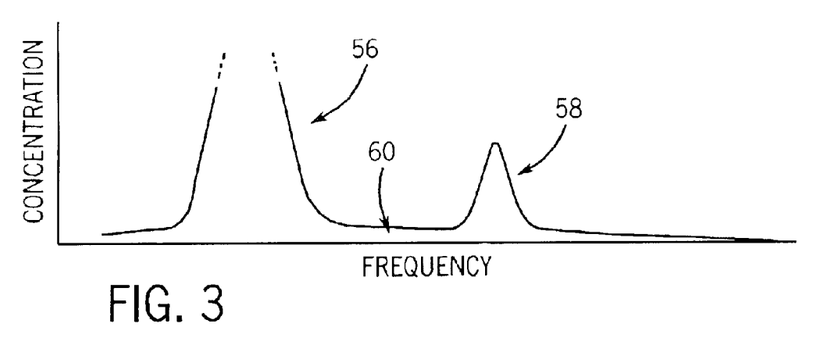
FIG. 3 is a graphical representation of a frequency spectrum associated with pure water.
Figure 4:
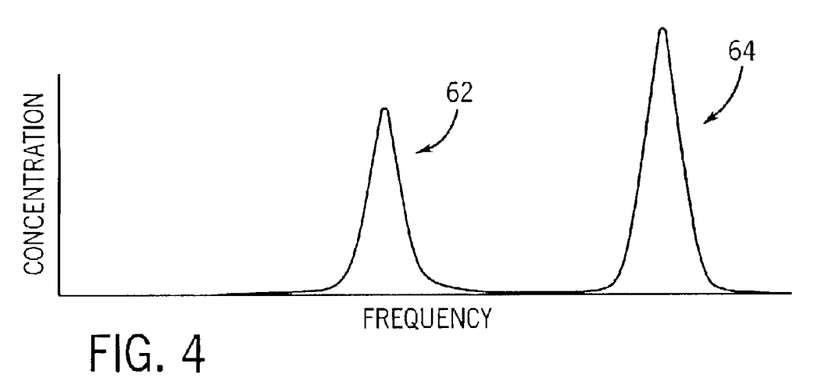
FIG. 4 is a graphical representation of a frequency spectrum associated with pure metabolites, such as choline and citrate.
Figure 5:
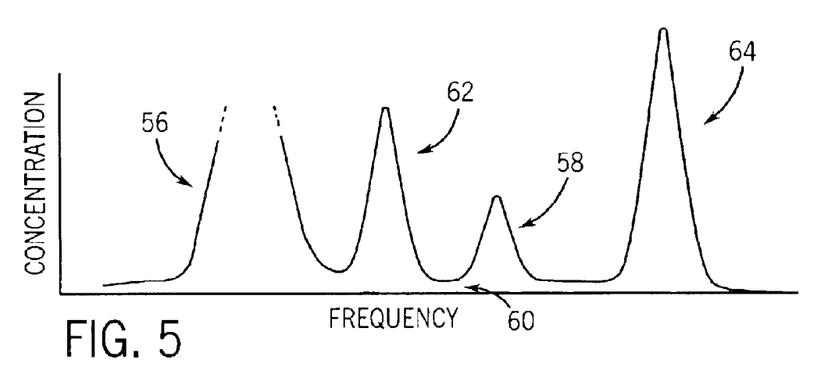
FIG. 5 is a graphical representation of a combined frequency spectrum associated with a solution of metabolites and water.

An example of such spectral information can be seen in FIGS. 3, 4, and 5, which respectively depict the spectrum of a solvent, representative solutes, and of solvent and solutes combined. For purposes of example only, the solvent depicted in FIGS. 3, 4, and 5 is water while the solutes depicted are common physiological metabolites choline and citrate. As discussed above, the placement of peaks along the x-axis is indicative of frequency, with peaks at a given frequency being indicative of a particular molecule. The height of the peak along the y-axis is indicative of the concentration of the molecules present.

Referring now to FIG. 3, the spectrum of water can be seen as comprising a large main peak 56 and a smaller artifact peak, or sideband, 58. The sideband 58 is a "ghost" image of the main peak 56 and typically results from imaging system imperfections, such as eddy currents, which produce some chemical shift within portions of the imaged volume. In addition, a raised baseline, or "water wings," 60 is typically present around the main water peak 56. FIG. 4, in comparison, represents a typical spectrum of the metabolites choline and citrate, represented by peaks 62 and 64 respectively, in the absence of water.

A solution of water and metabolites in the imaging volume, however, produces the combined spectrum of FIG. 5. As can be seen in FIG. 5, the main water peak 56 dwarfs the metabolite peaks 62, 64. In addition, the water sideband 58 may become confounded with the citrate peak 64, leading to interpretation difficulties. Further, the choline peak 62 is located upon the water wing 60 associated with the main water peak 56, leading to an overestimation of the concentration of choline within the imaged volume. Some method of solvent suppression is therefore generally desired in conjunction with voxel localization in order to obtain useful solute spectra within the voxels of a region of interest.

For example, spectral saturation techniques, such as chemical shift selective (CHESS) saturation, short-time inversion recovery (STIR) as well as others, may be employed prior to voxel localization to selectively suppress the solvent-related signal within a MRS sample. For simplicity and for explanatory purposes, the following discussion will be limited to the CHESS technique. However, it should be understood that any solvent suppression technique in which the degree of solvent suppression can be adjusted may be employed in accordance with the following technique.

For example, the CHESS saturation technique utilizes the different resonance frequencies of the undesired solvent and the solute of interest to selectively suppress the solvent signal during imaging. In particular, referring now to the exemplary CHESS saturation pulse sequence diagram depicted in FIG. 6, a selective RF pulse 70 (the CHESS pulse) spectrally tuned to the resonance frequency 56 of the solvent and having a flip angle α is applied to the region of interest, flipping the solvent magnetic vectors into the transverse plane. The amplitude of the CHESS pulse 70 determines α and thereby allows the operator to adjust the amount of solvent suppression applied. A large amplitude spoiler or "crusher" gradient 72 is applied after the CHESS pulse 70 to destroy the phase coherence of the signal, dephasing any undesired magnetizations. This saturation routine is immediately followed by the application of an imaging pulse sequence 74. Because the solvent nuclei will not produce a substantial signal after the CHESS pulse 70 until a sufficient recovery time has elapsed, approximately 100 milliseconds, the image produced by the imaging pulse sequence 74 will possess a solvent signal which is substantially suppressed.

Figure 6:
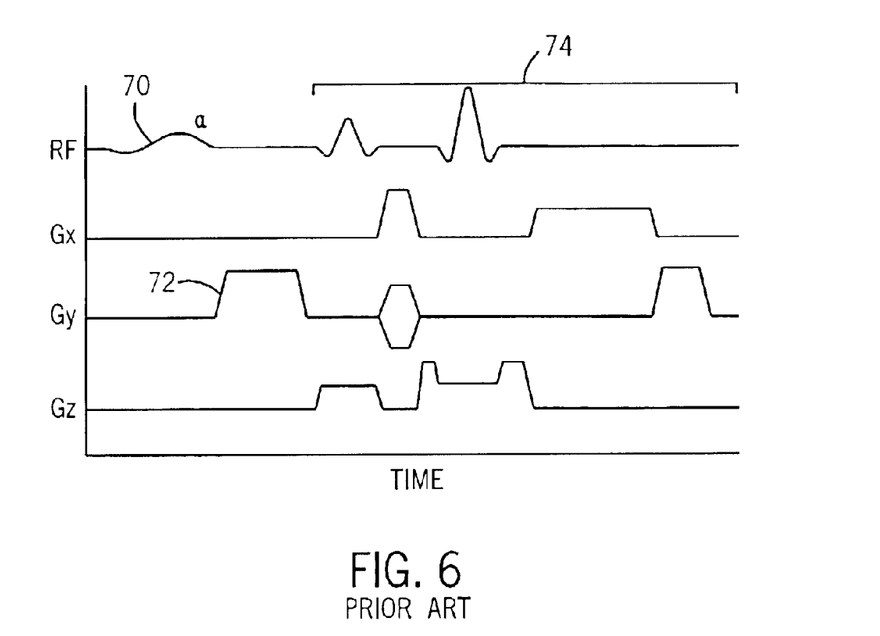
FIG. 6 is a pulse sequence diagram of an imaging sequence including a chemical suppression pulse.

The use of CHESS saturation techniques, however, can decrease the robustness of the spectroscopic images. In particular, the CHESS pulse 70 and crusher gradient 72 are functionally separate from the imaging pulse sequence 74 which can lead to mismatches which may invert of the main solvent peak 56, thereby distorting portions of the solute peaks 62, 64. Generally, the greater the level of suppression of the solvent, the greater the distortion of the solvent peak 56 and the surrounding solute peaks 62, 64. In addition, the complete suppression of the solvent peak 56 may eliminate reference frequency information which may be desired for image reconstruction. Preferably, the solvent signal 56 would be fully or partially modulated relative to the solute signals 62, 64 such that the solvent signal 56 would still provide useful frequency reference information while not confounding the solute signals 62, 64.

Figure 7:
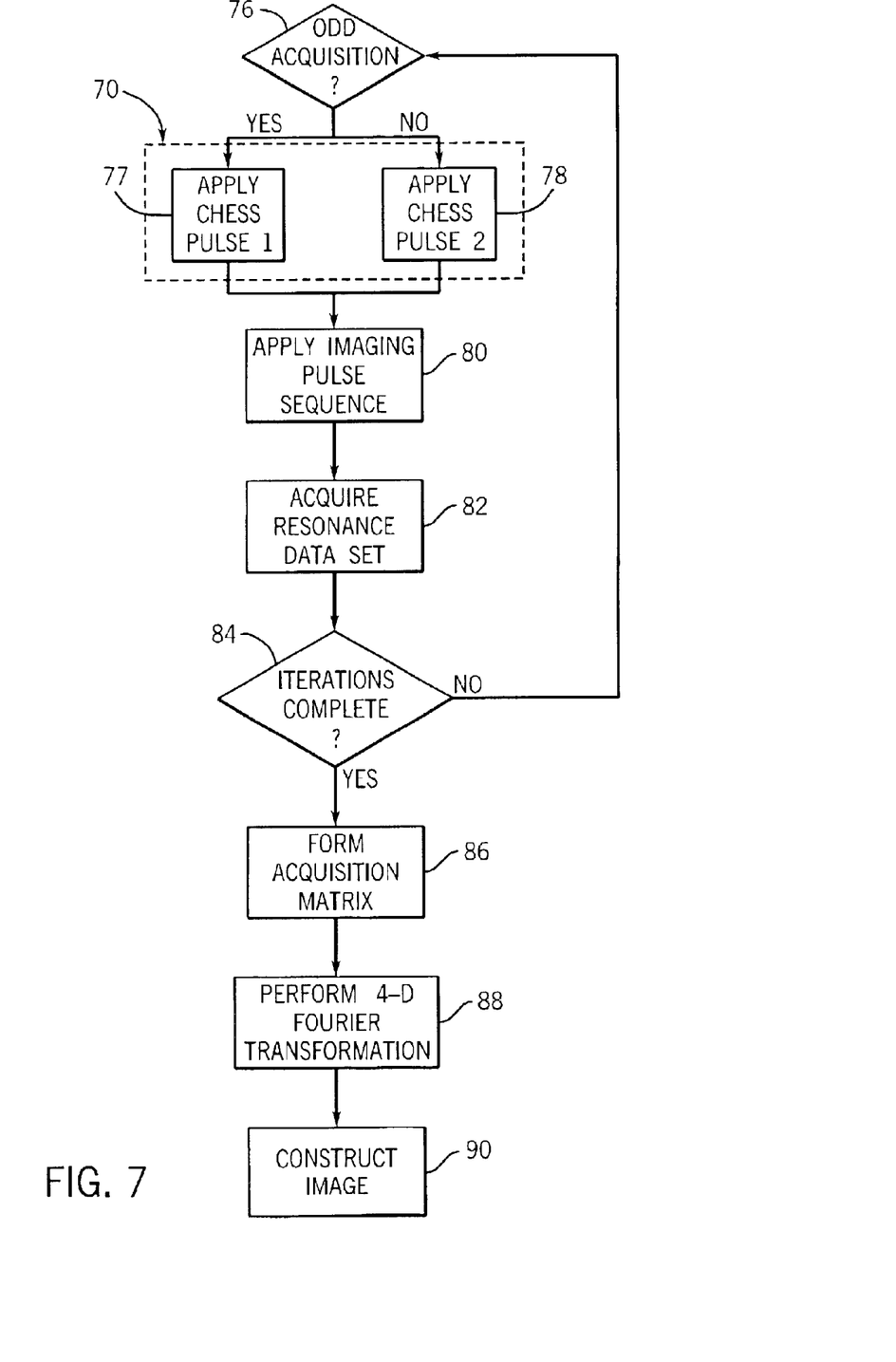
FIG. 7 is a flowchart depicting a technique in accordance with the aspects of the present invention.
Figure 8:
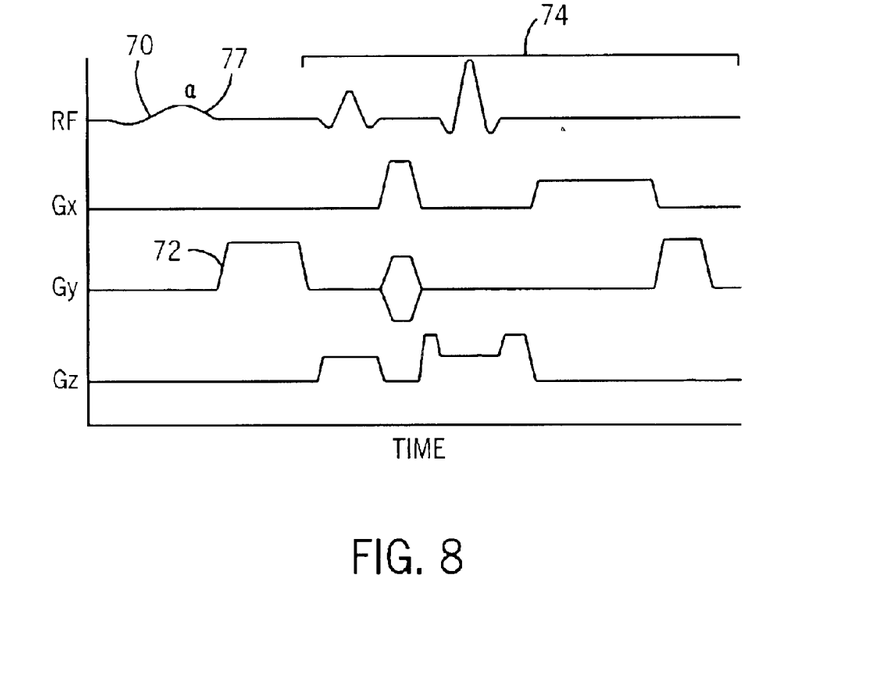
FIG. 8 is a first pulse sequence diagram in accordance with the present technique.
Figure 9:
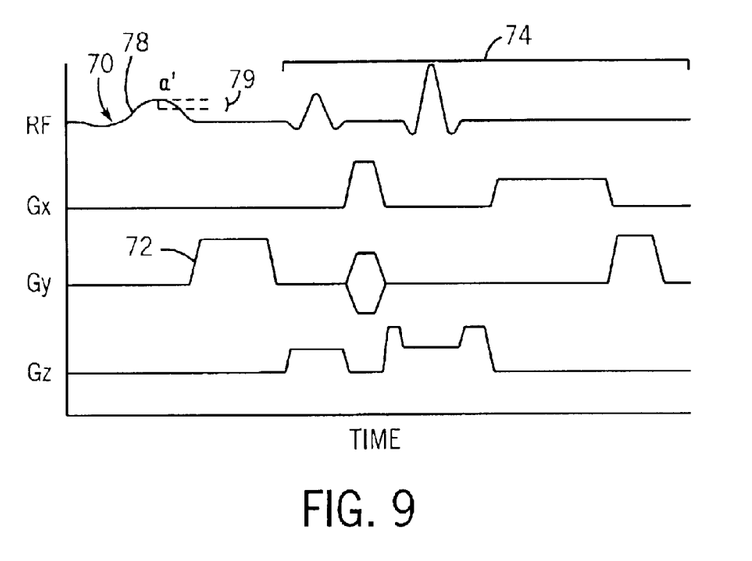
FIG. 9 is a second pulse sequence diagram in accordance with the present technique.

One technique by which this may be accomplished is depicted by the flowchart of FIG. 7 and by FIGS. 8 and 9. The depicted technique spatially shifts a portion of the solvent signal away from the solute signals during a chemical shift imaging (CSI) acquisition, allowing substantial separation and removal of the solvent signal.

Referring to FIG. 7, the sample is differentially suppressed using alternating CHESS pulses 70 such that different CHESS pulse profiles are applied during the odd and even acquisition periods, as determined at decision block 76. In particular, a first CHESS pulse 77 and a second CHESS pulse 78 are alternately applied prior to application of an imaging pulse sequence 74. The first CHESS pulse 77 and second CHESS pulse 78 differ in amplitude, as represented by amplitude difference 79 in FIG. 9, such that CHESS pulse 77 produces a solvent flip angle of α, while CHESS pulse 78 produces a solvent flip angle of α'. During each image data acquisition cycle, an imaging pulse sequence 74 is applied, as depicted at step 80, subsequent to the respective CHESS pulse 77, 78 and the resonance data set is acquired, as depicted at step 82.

Referring once again to FIG. 7, the sample is iteratively exposed to the alternating CHESS pulses 77, 78 and imaging pulse sequence 74 until a set number of odd/even iteration cycles has been reached, as determined at decision block 84. Once the set number of iterations has been reached, an acquisition matrix is formed from the acquired data, as depicted at step 86. A four-dimensional fast Fourier transformation is then performed on the acquisition matrix, as depicted in step 88, which provides three-dimensional location information and frequency (i.e. spectral) information for the data. Three of the four-dimensions of the transform provide the data to localize the imaged point in space, in lieu of using phase encoding, while the fourth-dimension provides the chemical frequency information or spectrum for that point. An image can then be constructed from the transformed data, as indicated at 90.

As a result of the alternating degrees of solvent suppression produced by alternating the CHESS pulses 77, 78, the solvent signal in the acquired data is partially modulated such that the reconstructed image possesses two water signals, one of which is spatially shifted by half a field of view, while the other is not shifted. The spatially-shifted solvent signal can be scaled, shifted within the field of view, or subtracted to remove the residual non-spatially shifted solvent signal. The respective amplitudes of the CHESS pulses 77 and 78 determine the proportion of the solvent signal which is spatially shifted and thereby also determine to what extent associated solvent artifacts, such as sidebands 58 and wings 69 in the case of water, are also spatially shifted.

For example, referring to FIGS. 8 and 9, in one exemplary embodiment the CHESS pulse 77 produces a flip angle α which may correspond to 100% solvent suppression while the alternating CHESS pulse 79 with flip angle α' may correspond to 0% solvent suppression. The water signal would be modulated between 0% and 100% suppression such that a percentage, here 50%, of the water signal 56, 58 would remain associated with the metabolite signals 62, 64. The remainder of the water signal would be shifted half a field of view away from the unshifted water signal and the metabolite signals 62, 64. By adjusting the respective amplitudes of the alternating CHESS pulses 77, 79, the relative percentage of water signal 56, 58 which is shifted may be adjusted.

Figure 10:
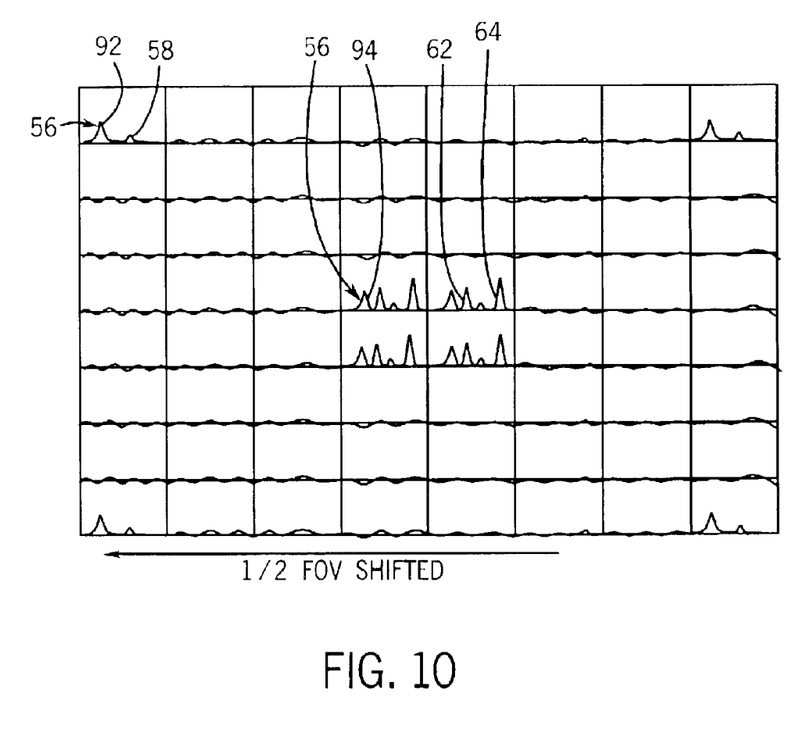
FIG. 10 is a representation of partially modulated water and metabolite spectra using magnetic resonance spectroscopic imaging according to the present technique.
Figure 11:
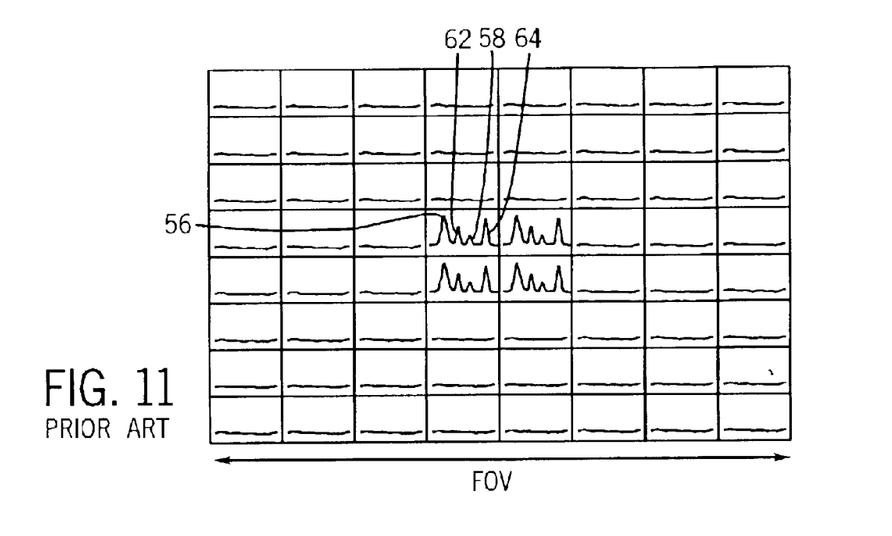
FIG. 11 is a prior art representation of a combined spectrum for metabolite in a water solvent using magnetic resonance spectroscopic imaging.

A representative two-dimensional slice of the resulting three-dimensional voxel image volume is depicted in FIG. 10 and a similar slice resulting from prior techniques is depicted in FIG. 11. For simplicity, water is depicted as the solvent and choline and citrate as the solutes of interest. Other solvents and solutes which produce overlapping or contiguous chemical spectra may be similarly processed and produce similar results. In addition, it should be understood that, in practice, other visual indicators, such as color coding, markers, or grayscaling, may be employed in lieu of the actual chemical spectra to convey the spectral information to a viewer. Any such visual indicators may also be applied to the spectral information as represented by the present technique.

Referring first to FIG. 11, it can be seen that, using previous techniques, the combined water 56, 58 and metabolite spectra 62, 64 are confounded within the field of view of the imaging volume at the location of the subject. Even if other techniques are employed to suppress the water signal, the spectra remain confounded. Referring now to FIG. 10, a slice of the resulting image after partial modulation of the water signal clearly demonstrates that the primary water spectrum 92 and metabolite spectra 62, 64 are spatially separated within the field of view of the imaging volume, with the primary water spectrum 92 being shifted half of a field of view away in both dimensions of a two-dimensional slice. A secondary water spectrum 94 is unshifted and remains contiguous to the metabolite spectra 62, 64. In the three-dimensional imaging volume, the primary water spectrum 92 is shifted half a field of view away from the metabolite spectrum in all three spatial dimensions.

Figure 12:
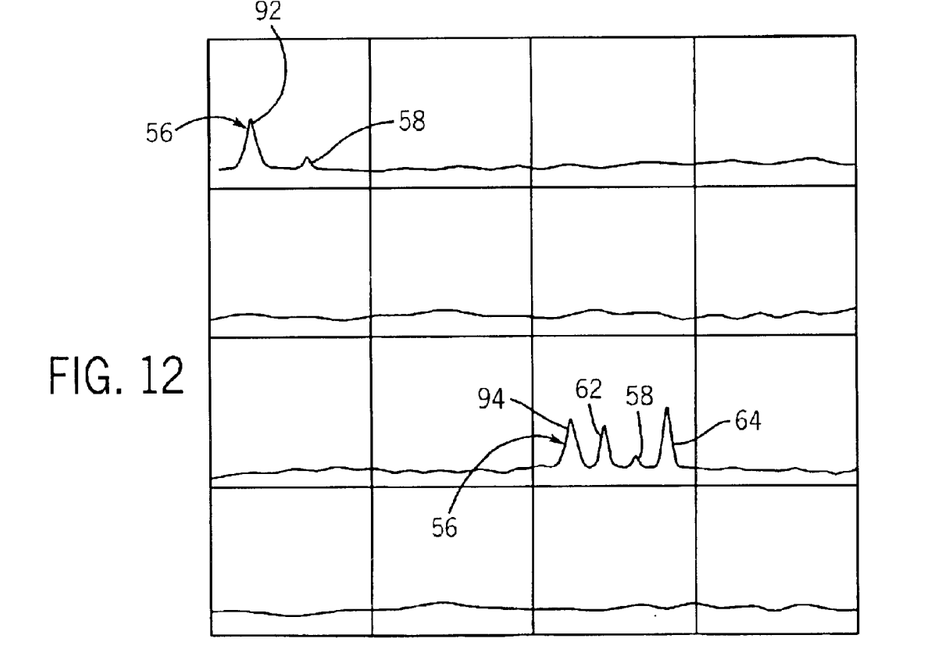
FIG. 12 is an alternative representation of spatially separated water and metabolite spectra using magnetic resonance spectroscopic imaging according to the present technique.

As can be seen in FIG. 10, the primary water signal 92 is actually split between the four corners of the slice, or presumably the eight corners of the three-dimensional volume. If, however, it is desired to maintain the primary water signal 92 in a single region of the field of view, the primary water spectrum 92 may be localized in a corner relative to the metabolite spectrum 62, 64 or in any other manner which maintains spatial separation of the spectra, as depicted in FIG. 12. As long as the sample signal of interest is less than one half of a field of view in width, the primary water signal 92 and its artifacts, i.e. the water sideband 58 and the water wing 60, will be spatially separated from the signal of interest, in this example, the choline peak 62 and the citrate peak 64. The signal of interest will therefore be substantially free of distortion from the primary water signal 92, yielding superior spectra from a single data set. Further, the remaining water signals 92, 94 are available to provide frequency information during image reconstruction and can later be removed via various artifact removal or suppression techniques, such as $B_0$ correction, if desired. While it is preferable that the water excitation phase be shifted by $\pi$ to maximize the separation, if due to RF pulse design constraints this cannot be achieved, a smaller phase shift may still be employed though the resulting primary water signal 92 spatial shift will also be reduced, requiring a larger field of view to obtain satisfactory separation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of partially modulating a solvent spectrum from one or more spectra of interest, comprising:
   alternately applying a first imaging pulse sequence preceded by a first solvent suppressing pulse and a second imaging pulse sequence preceded by a second solvent suppressing pulse to a sample, wherein the first solvent suppressing pulse suppresses a solvent spectrum by a first amount and the second solvent suppressing pulse suppresses the solvent spectrum by a different amount.

2. The method as recited in claim 1, further comprising acquiring a resonance data set resulting from each imaging pulse sequence before applying the alternate imaging pulse sequence.

3. The method as recited in claim 2, further comprising processing the resonance data sets to produce one or more spectra of interest.

4. The method as recited in claim 3, wherein processing the resonance data sets comprises performing a Fourier transformation of the resonance data sets.

5. The method as recited in claim 3, wherein processing the resonance data sets comprises constructing a spectroscopic image in which the solvent spectrum is partially modulated from one or more spectra of interest.

6. The method as recited in claim 1, wherein the solvent spectrum comprises a water spectrum and the one or more spectra of interest comprise a metabolite spectrum.

7. The method as recited in claim 1, wherein the first solvent suppressing pulse is a CHESS pulse of a first amplitude and the second solvent suppressing pulse in a CHESS pulse of a second amplitude.

8. A method of forming a magnetic resonance spectroscopic image, comprising:
   iteratively applying an imaging pulse sequence to a subject, wherein the imaging pulse sequence is alternately preceded by a first solvent suppressive pulse and a second solvent suppressive pulse which differ in the amount of solvent suppression they produce;
   acquiring a resonance data set resulting from each imaging pulse sequence before applying the subsequent imaging pulse sequence;
   forming an acquisition matrix from the resonance data sets;
   processing the acquisition matrix; and
   constructing a spectroscopic image from the processed matrix.

9. The method of claim 8, wherein the first solvent suppressive pulse is a CHESS pulse of a first amplitude and the second solvent suppressive pulse is a CHESS pulse of a second amplitude.

10. The method of claim 8, wherein processing the acquisition matrix comprises performing a Fourier transformation of the matrix.

11. The method of claim 8, wherein the spectroscopic image comprises a solvent spectrum partially modulated from one or more spectra of interest.

12. The method of claim 11, wherein the solvent spectrum comprises a water spectrum and the one or more spectra of interest comprise a metabolite spectrum.

13. A magnetic resonance spectroscopy imaging system, comprising:
   a magnetic resonance scanner;
   one or more control and acquisition circuits operably connected to the scanner;
   system controller circuitry operably connected to the one or more control and acquisition circuits, wherein the system controller circuitry is configured to iteratively apply an imaging pulse sequence to a subject, wherein the imaging pulse sequence is alternately preceded by a first solvent suppressive pulse and a second solvent suppressive pulse which differ in the amount of solvent suppression they produce, to acquire a resonance data set resulting from each imaging pulse sequence before applying the subsequent alternating imaging pulse sequence, and to process the resonance data sets to produce one or more spectra of interest; and
   an operator interface station operably connected to the system controller circuitry.

14. The system of claim 13, wherein the one or more spectra of interest comprise a metabolite spectrum and a partially modulated solvent spectrum.

15. The system of claim 14, wherein the partially modulated solvent spectrum comprises a partially modulated water spectrum.

16. The system of claim 13, wherein the system controller circuitry processes the resonance data sets by performing a Fourier transformation.

17. A computer program for partially modulating a solvent spectrum relative to one or more spectra of interest, comprising:
   a machine readable medium for supporting machine readable code; and
   configuration code stored on the machine readable medium for applying two or more imaging pulse sequences to a subject, wherein the imaging pulse sequences are alternately preceded by a first solvent suppressive pulse and a second solvent suppressive pulse which differ in the amount of solvent suppression they produce.

18. The computer program of claim 17, wherein the first solvent suppressive pulse is a CHESS pulse of a first magnitude and the second solvent suppressive pulse is a CHESS pulse of a second magnitude.

19. The computer program of claim 17, wherein the configuration code is further configured for acquiring a resonance data set resulting from each imaging pulse sequence before applying the alternating pulse sequence and for processing the resonance data sets to produce one or more spectra of interest.

20. The computer program of claim 19, wherein processing the resonance data sets comprises performing a Fourier transformation of the data sets.

21. The computer program of claim 19, wherein the one or more spectra of interest comprise a metabolite spectrum and a partially modulated solvent spectrum.

22. The computer program of claim 21, wherein the solvent comprises water.

23. A magnetic resonance spectroscopy imaging system, comprising:

a magnetic resonance scanner;

one or more control and acquisition circuits operably connected to the scanner;

system controller circuitry operably connected to the one or more control and acquisition circuits, wherein the system controller circuitry comprises means for producing a magnetic resonance spectroscopic image in which a solvent spectrum is partially modulated from one or more spectra of interest; and an operator interface station operably connected to the system controller circuitry.

24. The system of claim 23 in which the solvent spectrum comprises a water spectrum and the one or more spectra of interest comprise a metabolite spectrum.

* * * * *